United States Patent
Kim et al.

(10) Patent No.: US 11,227,987 B2
(45) Date of Patent: Jan. 18, 2022

(54) HEAT CONVERSION DEVICE

(71) Applicant: LG INNOTEK CO., LTD., Seoul (KR)

(72) Inventors: Sook Hyun Kim, Seoul (KR); Yong Joo Lee, Seoul (KR); Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/618,533

(22) PCT Filed: Jun. 7, 2018

(86) PCT No.: PCT/KR2018/006477
§ 371 (c)(1),
(2) Date: Dec. 2, 2019

(87) PCT Pub. No.: WO2018/226044
PCT Pub. Date: Dec. 13, 2018

(65) Prior Publication Data
US 2020/0168780 A1   May 28, 2020

(30) Foreign Application Priority Data
Jun. 8, 2017   (KR) .................. 10-2017-0071492

(51) Int. Cl.
*H01L 35/30* (2006.01)
*H01L 23/367* (2006.01)
(Continued)

(52) U.S. Cl.
CPC .......... *H01L 35/30* (2013.01); *H01L 23/3672* (2013.01); *H01L 35/10* (2013.01); *H01L 35/32* (2013.01)

(58) Field of Classification Search
CPC ... H01L 23/34–4093; H01L 2023/4018–4087; H01L 35/00–34
See application file for complete search history.

(56) References Cited

U.S. PATENT DOCUMENTS

| 6,530,231 B1 * | 3/2003 | Nagy ............ F25B 21/02 136/203 |
| 2006/0250771 A1 * | 11/2006 | Heine ............ F21V 29/70 361/695 |

(Continued)

FOREIGN PATENT DOCUMENTS

| CN | 201228671 Y | 4/2009 |
| CN | 206944790 U * | 1/2018 |

(Continued)

OTHER PUBLICATIONS

International Search Report dated Sep. 28, 2018 issued in Application No. PCT/KR2018/006477.
(Continued)

*Primary Examiner* — William E McClain
(74) *Attorney, Agent, or Firm* — Ked & Associates, LLP

(57) ABSTRACT

A heat conversion device according to an embodiment of the present invention comprises: a plurality of P-type thermoelectric legs and a plurality of N-type thermoelectric legs which are electrically connected and arranged in an array; an insulating part disposed on one surface of the plurality of P-type thermoelectric legs and the plurality of N-type thermoelectric legs; a heat sink disposed on the insulating part; a fan disposed spaced a predetermined distance from the heat sink; and a plurality of fastening members having moduli of elasticity of $1*10^3$ kgf/cm$^2$ to $30*10^3$ kgf/cm$^2$ and fixing the heat sink and the fan. Each one of the fastening members comprises: a shaft part; a first fixed part which is disposed at one end of the shaft part and fixed to the heat sink; a second fixed part which protrudes from an outer circumferential surface of the shaft part and is fixed to the fan; and a separating part which protrudes from the outer circumferential surface of the shaft part and is disposed between the heat sink and the fan to separate the heat sink and the fan, wherein the width of the second fixed part (Continued)

increases toward the first fixed part, and the shaft part, the first fixed part, the second fixed part, and the separating part are integrally formed.

16 Claims, 14 Drawing Sheets

(51) Int. Cl.
*H01L 35/10* (2006.01)
*H01L 35/32* (2006.01)

(56) References Cited

U.S. PATENT DOCUMENTS

| | | | |
|---|---|---|---|
| 2007/0237602 A1* | 10/2007 | Xia | F16B 19/004 411/178 |
| 2010/0002389 A1* | 1/2010 | Tung | H05K 7/20172 361/697 |
| 2010/0242523 A1 | 9/2010 | Rubright | |
| 2014/0209273 A1* | 7/2014 | Hsu | H01L 23/4093 165/80.2 |
| 2018/0274825 A1* | 9/2018 | Choi | F25D 19/00 |
| 2019/0277555 A1* | 9/2019 | Yoo | F25D 23/003 |
| 2019/0285355 A1* | 9/2019 | Lee | F25D 23/003 |

FOREIGN PATENT DOCUMENTS

| | | | |
|---|---|---|---|
| EP | 2 762 994 A1 | 8/2014 | |
| EP | 3 604 989 A1 | 2/2020 | |
| JP | 2001-165525 | 6/2001 | |
| JP | 2015-037129 | 2/2015 | |
| KR | 20070029508 A * | 3/2007 | |
| KR | 10-0926901 | 11/2009 | |
| KR | 20-0457138 | 12/2011 | |
| KR | 10-2014-0055285 | 5/2014 | |
| WO | WO-2018174468 A1 * | 9/2018 | F25B 21/02 |

OTHER PUBLICATIONS

Extended European Search Report dated Feb. 24, 2021 issued in Application 18812847.4.
Chinese Office Action dated Mar. 1, 2021 issued in Application 201880038223.3.

* cited by examiner

[FIG. 1]
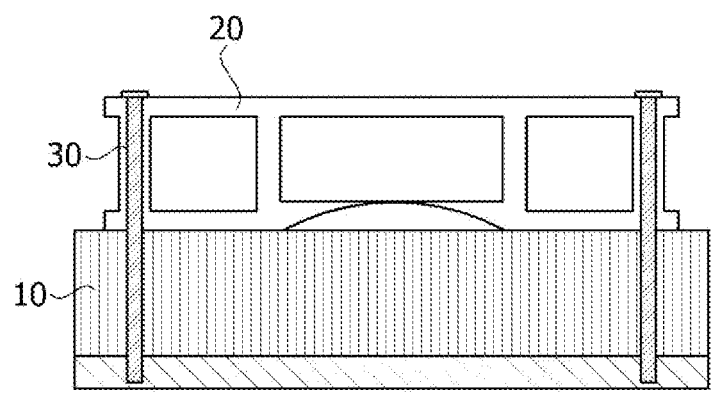

[FIG. 2]
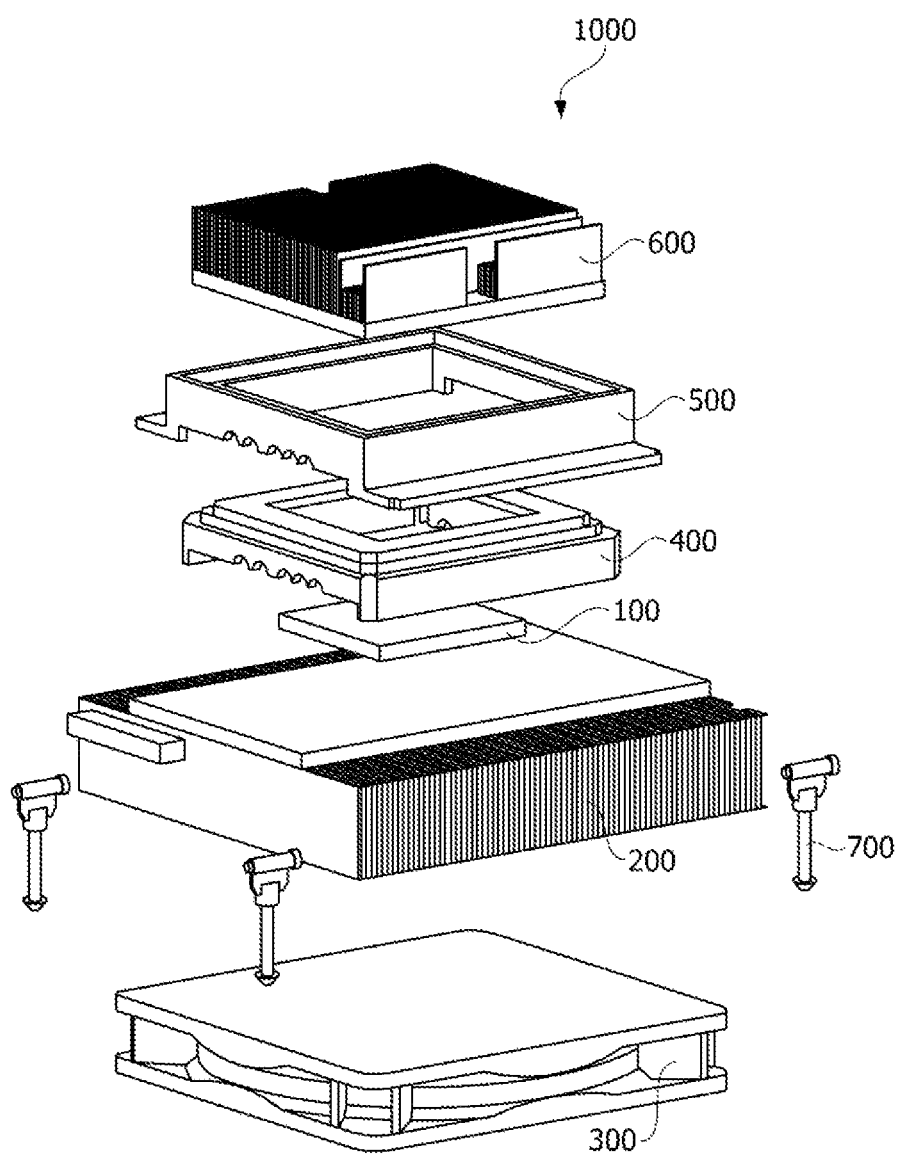

[FIG. 3]
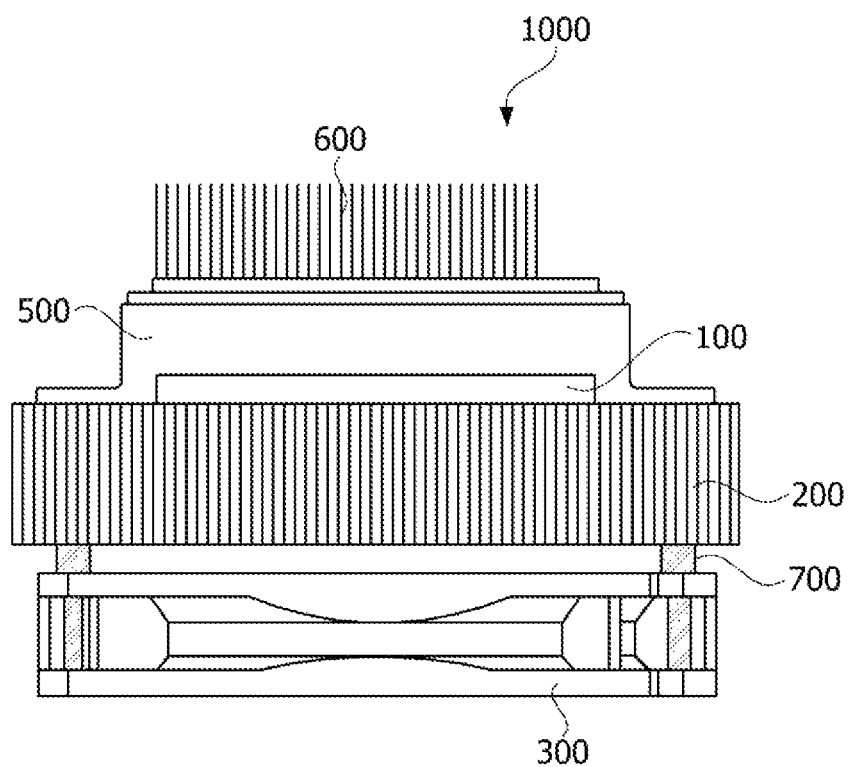

[FIG. 4]
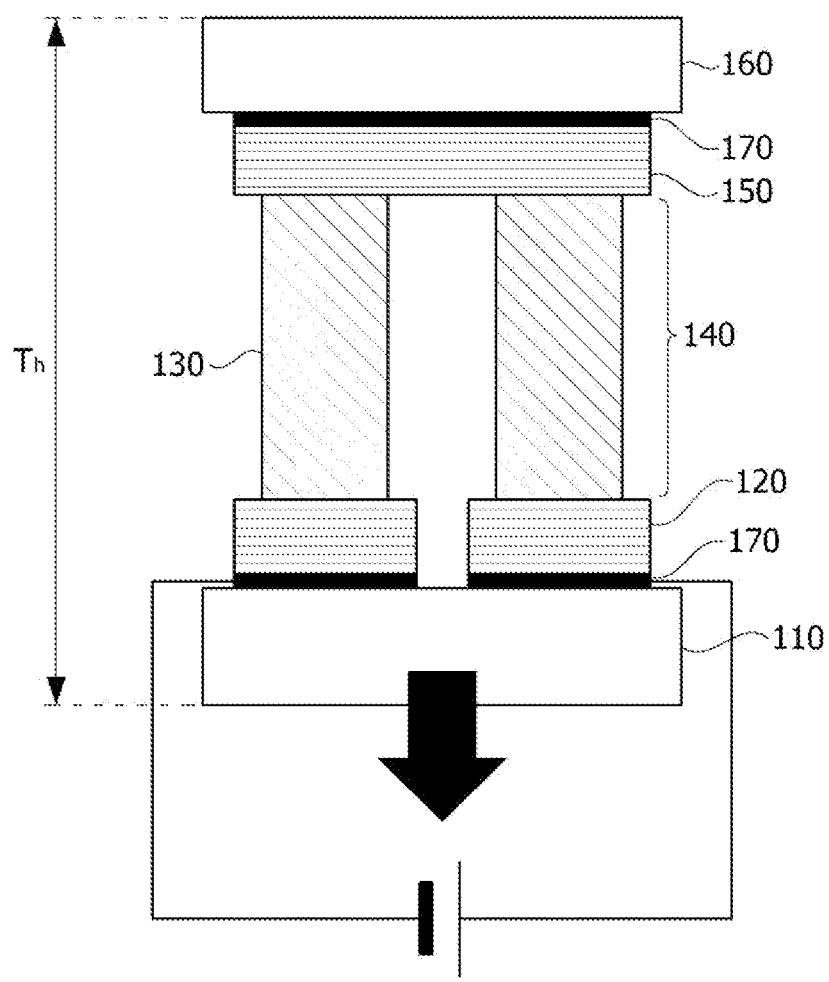

[FIG. 5]
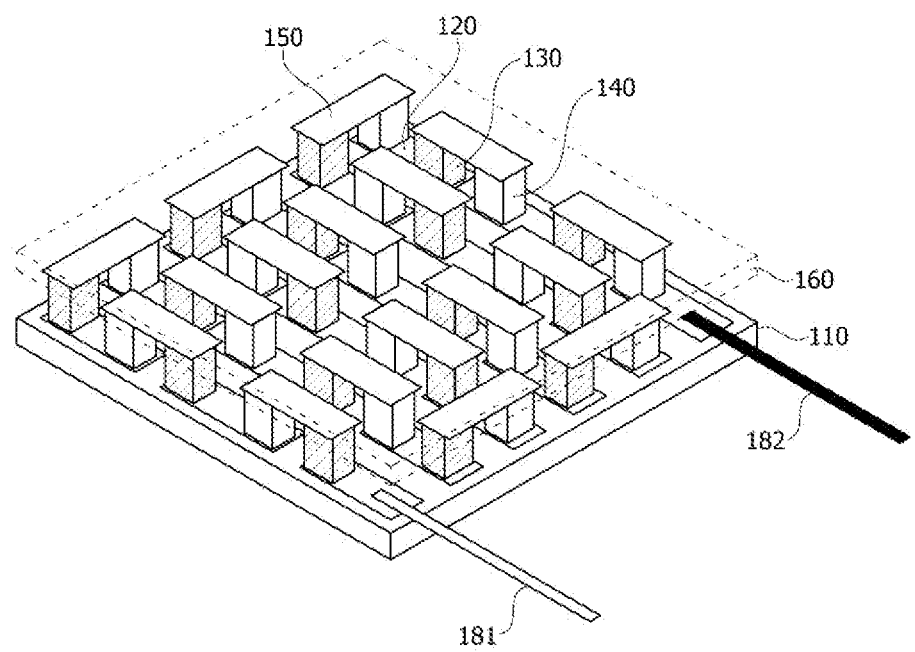

[FIG. 6]
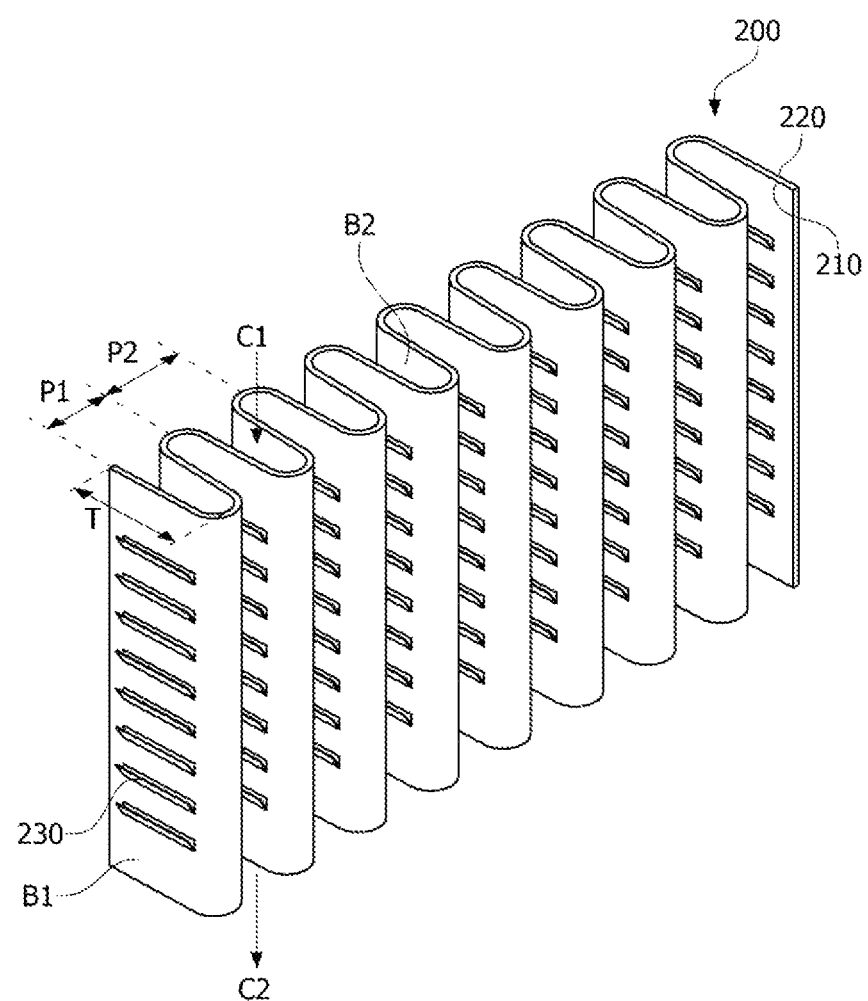

[FIG. 7]
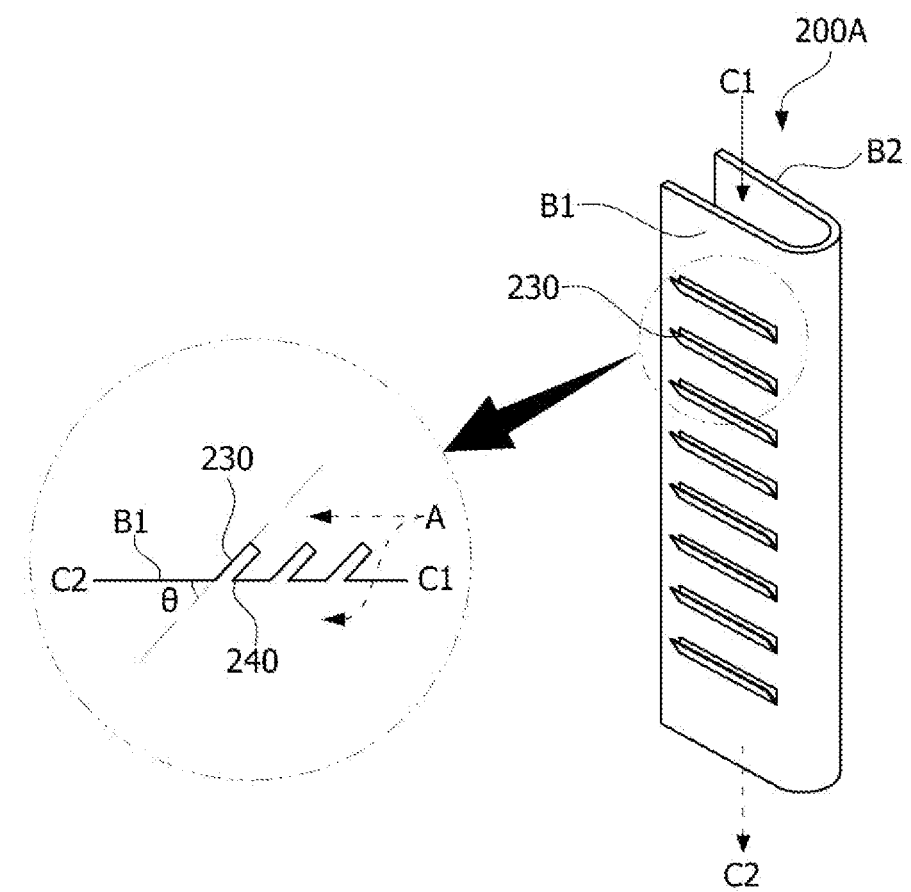

[FIG. 8]
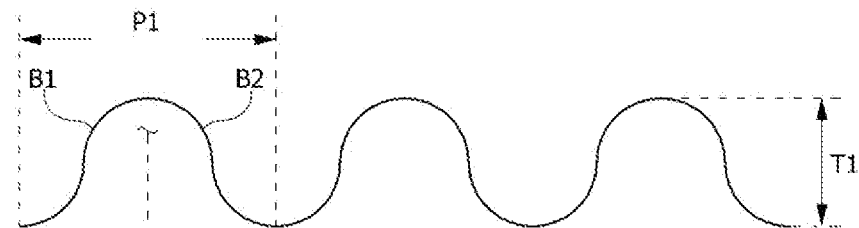
(a)
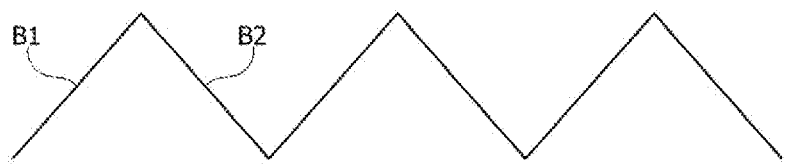
(b)
(c)
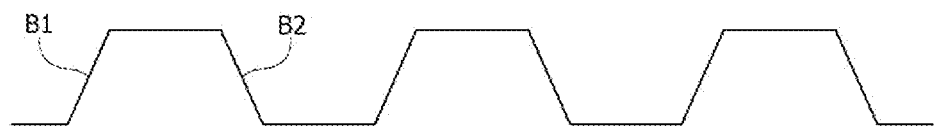
(d)

[FIG. 9]
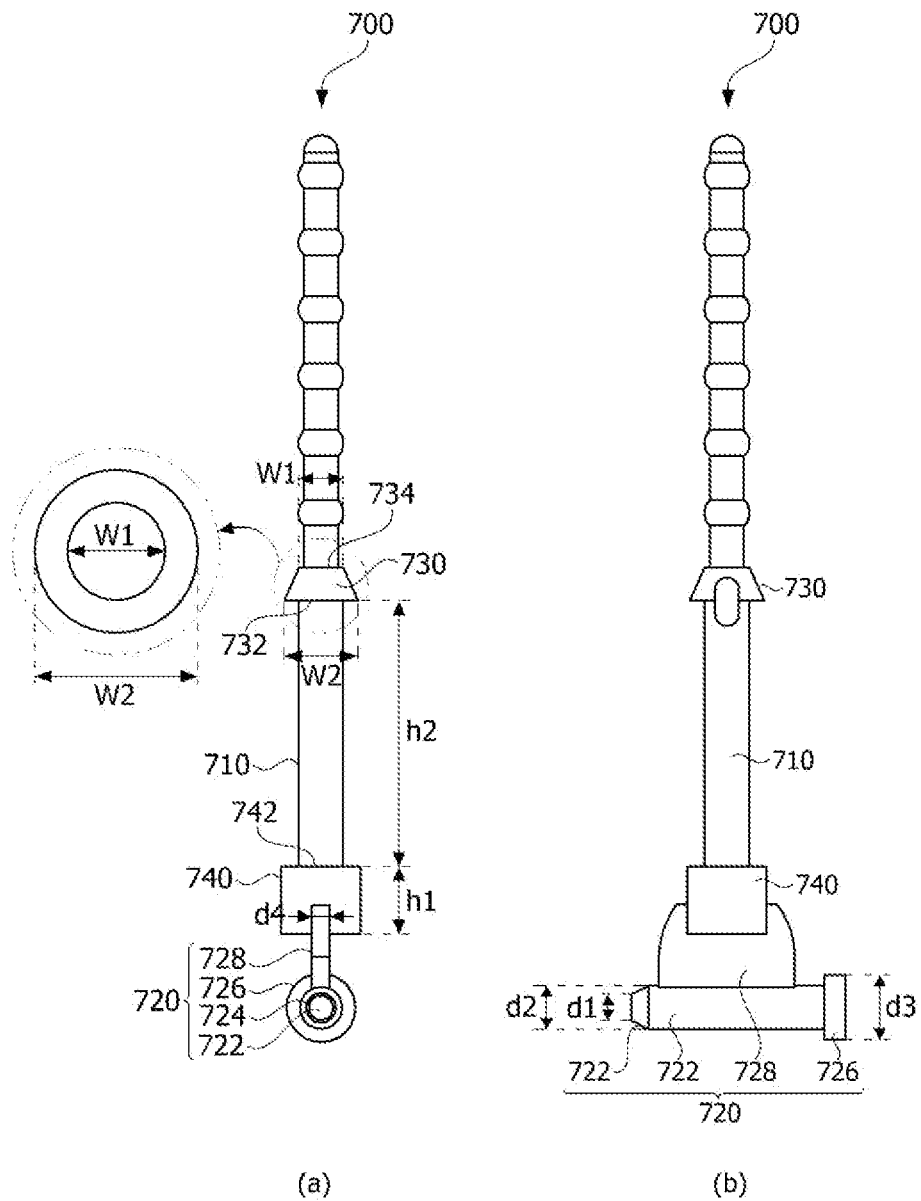

[FIG. 10]
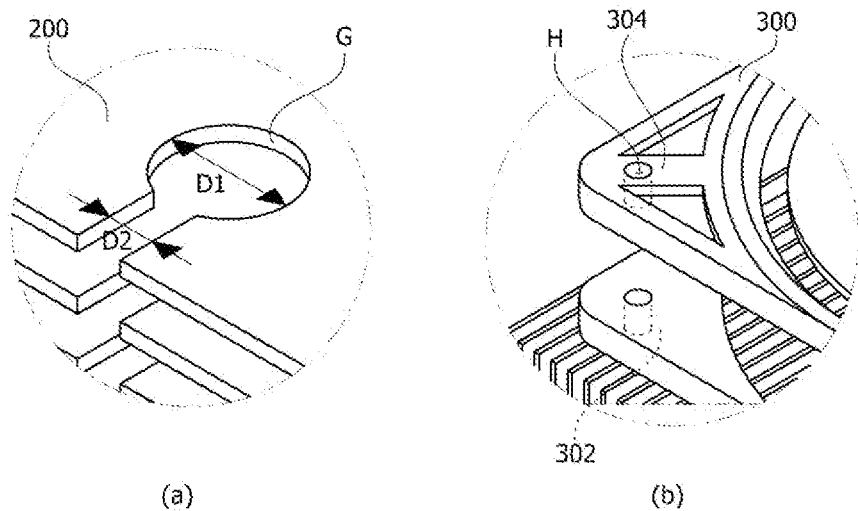

[FIG. 11]
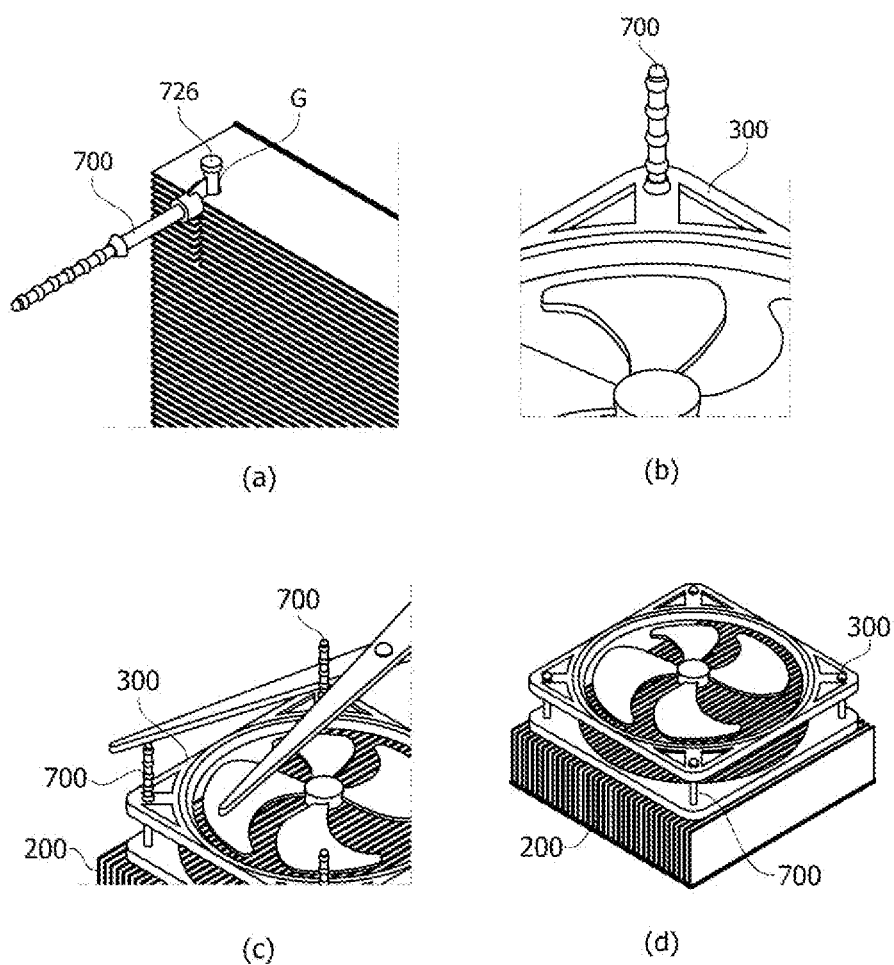

[FIG. 12]
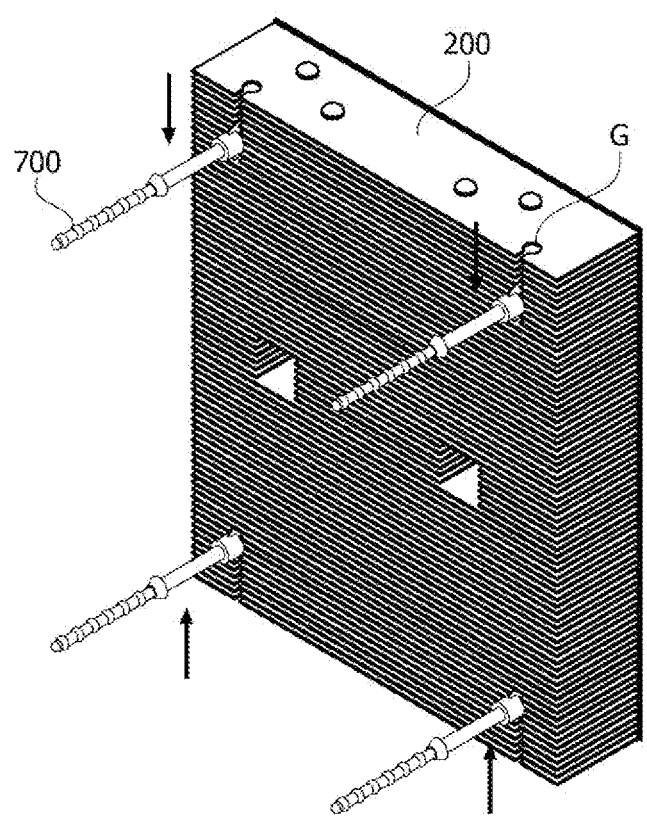

[FIG. 13]
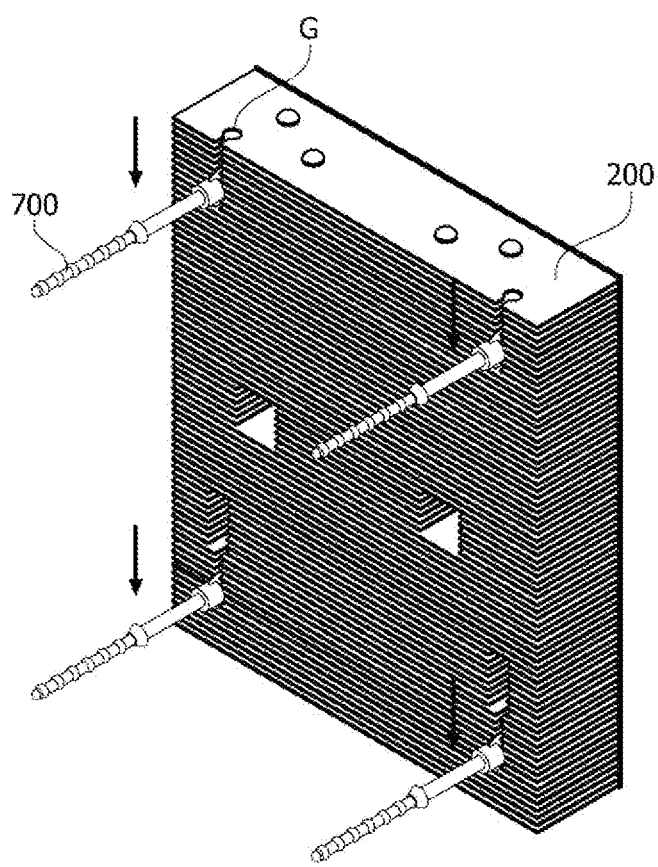

[FIG. 14]
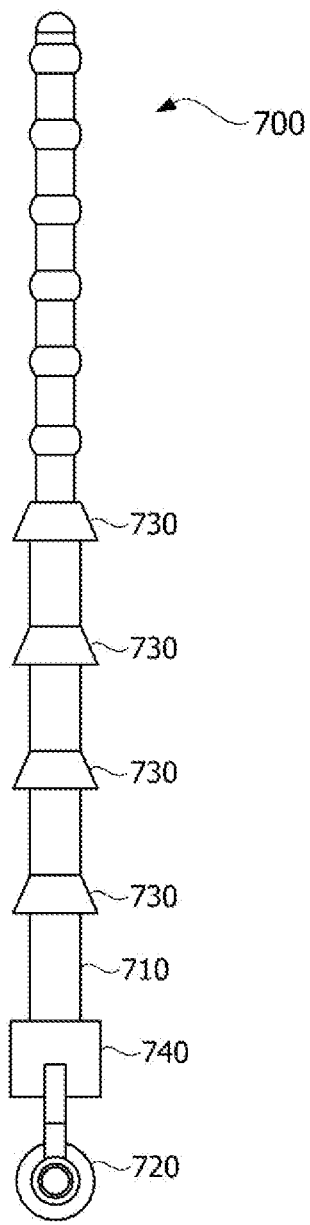

HEAT CONVERSION DEVICE

CROSS-REFERENCE TO RELATED PATENT APPLICATIONS

This application is a U.S. National Stage Application under 35 U.S.C. § 371 of PCT Application No. PCT/KR2018/006477, filed Jun. 7, 2018, which claims priority to Korean Patent Application No. 10-2017-0071492, filed Jun. 8, 2017, whose entire disclosures are hereby incorporated by reference.

TECHNICAL FIELD

The present invention relates to a heat conversion device using a thermoelectric element, and more specifically, to a coupling structure between a heat sink and a fan included in a heat conversion device.

BACKGROUND ART

A thermoelectric effect is a phenomenon occurring due to movement of electrons and holes in a material and means direct energy conversion between heat and electricity.

A thermoelectric element is a generic term of elements in which a thermoelectric effect is used and has a structure in which P-type thermoelectric materials and N-type thermoelectric materials disposed between metal electrodes are bonded to form PN junction pairs.

Thermoelectric elements may be divided into elements which use a change in electrical resistance according to a change in temperature, elements which use the Seebeck effect in which an electromotive force is generated due to a difference in temperature, and elements which use the Peltier effect in which heating or heat absorption occurs due to a current.

Thermoelectric elements are being variously applied to home appliances, electronic components, communication components, and the like. For example, the thermoelectric elements may be applied to cooling apparatuses, heating apparatuses, power generation apparatuses, and the like. Therefore, the demand for heat conversion performance of the thermoelectric elements is gradually increasing.

Generally, a heat conversion device using a thermoelectric element may have a structure in which a heat sink is disposed at a side of a heat-absorbing portion and a heat sink and a fan are disposed at a side of a heating portion.

FIG. 1 is a view illustrating one example of a coupling structure between a heat sink and a fan at a side of a heating portion of a heat conversion device.

Referring to FIG. 1, a heat sink 10 and a fan 20 may be assembled using screws 30. Therefore, since the heat sink 10 is in direct contact with the fan 20, when the fan 20 operates, noise and vibration may occur. In addition, there may be a problem in that the fan 20 is bent due to a strong external force when the screws 30 are coupled thereto.

DISCLOSURE

Technical Problem

The present invention is directed to providing a coupling structure between a heat sink and a fan included in a heat conversion device.

Technical Solution

One aspect of the present invention provides a heat conversion device including a plurality of P-type thermoelectric legs and a plurality of N-type thermoelectric legs which are electrically connected and disposed in an array type, an insulating portion disposed on one surface of each of the plurality of P-type thermoelectric legs and the plurality of N-type thermoelectric legs, a heat sink disposed on the insulating portion, a fan disposed to be spaced a predetermined distance from the heat sink, and a plurality of coupling members have an elastic modulus ranging from $1*10^3$ kgf/cm2 to $30*10^3$ kgf/cm2 and fix the heat sink and the fan, wherein each of the coupling members includes a shaft, a first fixing portion disposed on one end of the shaft and fixed to the heat sink, a second fixing portion which protrudes from an outer circumferential surface of the shaft and is fixed to the fan, and a separating portion which protrudes from the outer circumferential surface of the shaft, is disposed between the heat sink and the fan, and separates the heat sink from the fan, wherein a width of the second fixing portion increases in a direction toward the first fixing portion, and the shaft, the first fixing portion, the second fixing portion, and the separating portion are integrally formed.

The second fixing portion may have a circular truncated conical form.

The separating portion may be connected to the first fixing portion and disposed between the first fixing portion and the second fixing portion, the fan may include a hole through which the shaft passes, a first surface of the separating portion may be in contact with a first periphery of the hole, a first surface of the second fixing portion may be in contact with a second periphery of the hole, a width of each of the first surface of the separating portion and the first surface of the second fixing portion may be greater than a diameter of the hole.

The width of the first surface of the second fixing portion may range from 120 to 180% of the diameter of the hole, and a width of a second surface, which is opposite to the first surface of the second fixing portion, of the second fixing portion may range from 50 to 80% of the diameter of the hole.

A distance between the first surface of the separating portion and the first surface of the second fixing portion may range from 0.9 to 1 times a height of the fan.

At least a part between the second fixing portion and the shaft may be empty.

The second fixing portion may have a circular truncated cone form including at least one groove formed in a bottom surface thereof.

At least a part in the shaft from which the second fixing portion protrudes may be empty.

The coupling member may include a silicone resin.

A groove for fixing the first fixing portion may be formed in the heat sink.

A height of the separating portion may range from 1 to 10 mm.

The heat sink may be disposed on a heating surface of the thermoelectric element.

The coupling member may have a hardness ranging from 40 to 90 Hs.

Advantageous Effects

According to the embodiments of the present invention, a heat conversion device of which heat conversion performance is high and noise and vibration are low can be obtained. In addition, according to the embodiment of the present invention, the heat conversion device can be easily assembled.

DESCRIPTION OF DRAWINGS

FIG. 1 is a view illustrating one example of a coupling structure between a heat sink and a fan at a side of a heating portion of a heat conversion device.

FIG. 2 is an exploded perspective view illustrating a heat conversion device according to one embodiment of the present invention.

FIG. 3 is a cross-sectional view illustrating the heat conversion device according to one embodiment of the present invention.

FIG. 4 is a cross-sectional view illustrating a thermoelectric element included in the heat conversion device according to one embodiment of the present invention.

FIG. 5 is a perspective view illustrating thermoelectric elements included in the heat conversion device according to one embodiment of the present invention.

FIGS. 6 to 8 are views for describing one example of a heat sink.

FIG. 9 is a view illustrating a coupling member included in the heat conversion device according to one embodiment of the present invention.

FIG. 10 is a view illustrating a part of the heat sink and a part of a fan for coupling the coupling member thereto according to one embodiment of the present invention.

FIGS. 11 to 13 are views showing a process in which a first heat sink and the fan are coupled using the coupling member according to one embodiment of the present invention.

FIG. 14 is a side view illustrating a coupling member according to another embodiment of the present invention.

MODES OF THE INVENTION

As the invention allows for various changes and numerous embodiments, specific embodiments will be illustrated in the drawings and described in detail in the written description. However, this is not intended to limit the present invention to specific modes of practice, and it is to be appreciated that all changes, equivalents, and substitutes that do not depart from the spirit and technical scope of the present invention are encompassed in the present invention.

It will be understood that, although the terms "first," "second," etc. may be used herein to describe various elements, these elements should not be limited to the terms. The terms are only used to distinguish one element from another. For example, a first element could be termed a second element, and a second element could similarly be termed a first element without departing from the scope of the present invention. As used herein, the term "and/or" includes any one or combinations of the associated listed items.

It will be understood that when an element is referred to as being "connected" or "coupled" to another element, it may be directly connected or coupled to another element or intervening elements may be present. In contrast, when an element is referred to as being "directly connected" or "directly coupled" to another element, there are no intervening elements.

The terminology used herein is for the purpose of describing specific embodiments only and is not intended to be limiting to the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Example embodiments of the invention will be described below in more detail with reference to the accompanying drawings. Components that are the same or are corresponding to each other are rendered as the same reference numeral regardless of the figure number, and redundant descriptions thereof will be omitted.

FIG. 2 is an exploded perspective view illustrating a heat conversion device according to one embodiment of the present invention, FIG. 3 is a cross-sectional view illustrating the heat conversion device according to one embodiment of the present invention, FIG. 4 is a cross-sectional view illustrating a thermoelectric element included in the heat conversion device according to one embodiment of the present invention, FIG. 5 is a perspective view illustrating thermoelectric elements included in the heat conversion device according to one embodiment of the present invention, and FIGS. 6 to 8 are views for describing one example of a heat sink.

Referring to FIGS. 2 and 3, a heat conversion device 1000 includes a thermoelectric element 100, a first heat sink 200, a fan 300, a heat insulating member 400, a housing 500, and a second heat sink 600.

Referring to FIGS. 4 and 5, the thermoelectric element 100 according to the embodiment of the present invention includes a lower substrate 110, lower electrodes 120, a P-type thermoelectric leg 130, an N-type thermoelectric leg 140, an upper electrode 150, and an upper substrate 160.

The lower electrodes 120 are disposed between the lower substrate 110 and lower floor surfaces of the P-type thermoelectric leg 130 and the N-type thermoelectric leg 140, and the upper electrode 150 is disposed between the upper substrate 160 and upper floor surfaces of the P-type thermoelectric leg 130 and the N-type thermoelectric leg 140. Accordingly, a plurality of P-type thermoelectric legs 130 and a plurality of N-type thermoelectric legs 140 are electrically connected by lower electrodes 120 and upper electrodes 150. The pair of P-type thermoelectric leg 130 and N-type thermoelectric leg 140 which are disposed between the lower electrodes 120 and the upper electrode 150 and electrically connected to each other may form a unit cell.

For example, when a voltage is applied between the lower electrodes 120 and the upper electrode 150 through lead wires 181 and 182, due to the Peltier effect, the substrate through which a current flows from the P-type thermoelectric leg 130 to the N-type thermoelectric leg 140 absorbs heat and thus serves as a cooling part, and the substrate through which a current flows from the N-type thermoelectric leg 140 to the P-type thermoelectric leg 130 is heated and thus serves as a heating part. In the present specification, the heat-absorbing surface may also be one surface of the substrate serving as the cooling part, and the heating surface may also be one surface of the substrate serving as the heating part.

Here, the P-type thermoelectric leg 130 and the N-type thermoelectric leg 140 may be bismuth-telluride (Bi—Te)-based thermoelectric legs mainly including bismuth (Bi) and tellurium (Te). The P-type thermoelectric leg 130 may be a thermoelectric leg including a Bi—Te-based main material containing at least one among antimony (Sb), nickel (Ni), aluminum (Al), copper (Cu), silver (Ag), lead (Pb), boron (B), gallium (Ga), tellurium (Te), bismuth (Bi), and indium (In) in the range of 99 to 99.999 wt % and a mixture containing Bi or Te in the range of 0.001 to 1 wt % based on a total weight of 100 wt %. For example, a main material of the P-type thermoelectric leg 130 may be Bi-selenium (Se)—Te, and the P-type thermoelectric leg 130 may further include Bi or Te in the range of 0.001 to 1 wt % based on a total weight. The N-type thermoelectric leg 140 may be a thermoelectric leg including a Bi—Te-based main material containing at least one among Se, Ni, Cu, Ag, Pb, B, Ga, Te, Bi, and In in the range of 99 to 99.999 wt % and a mixture containing Bi or Te in the range of 0.001 to 1 wt % based on a total weight of 100 wt %. For example, a main material of the N-type thermoelectric leg 140 may be Bi—Sb—Te, and the N-type thermoelectric leg 140 may further include Bi or Te in the range of 0.001 to 1 wt % based on a total weight.

The P-type thermoelectric leg 130 and the N-type thermoelectric leg 140 may be formed in a bulk type or a stacked type. Generally, the bulk type P-type thermoelectric leg 130 or the bulk type N-type thermoelectric leg 140 may be formed by performing a thermal process on a thermoelectric material to manufacture an ingot, grinding and straining the ingot to obtain a powder for a thermoelectric leg, sintering the powder, and cutting a sintered body. The stacked type P-type thermoelectric leg 130 or the stacked type N-type thermoelectric leg 140 may be formed by coating a sheet-shaped base with a paste including a thermoelectric material to form unit members, stacking the unit members, and cutting the stacked unit members.

In this case, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or cross sectional area of the N-type thermoelectric leg 140 may be different from that of the P-type thermoelectric leg 130.

The performance of the thermoelectric element according to one embodiment of the present invention may be expressed as a Seebeck index. The Seebeck index (ZT) may be expressed by Equation 1.

$$ZT = \alpha^2 \cdot \sigma \cdot T/k \qquad \text{[Equation 1]}$$

In this case, $\alpha$ is the Seebeck coefficient [V/K], $\sigma$ is electric conductivity [S/m], $\alpha^2 \cdot \sigma$ is a power factor [W/mK2]. In addition, T is temperature, k is thermal conductivity [W/mK]. K may be expressed as $a \cdot cp \cdot \rho$, wherein a is thermal diffusivity [cm2/S], cp is specific heat [J/gK], and $\rho$ is density [g/cm3].

In order to obtain a Seebeck index of a thermoelectric element, a Z value [V/K] is measured using a Z meter, and then, the Seebeck index (ZT) may be calculated using the measured Z value.

Meanwhile, each of the lower electrodes 120 disposed between the lower substrate 110 and the P-type thermoelectric leg 130 and between the lower substrate 110 and the N-type thermoelectric leg 140, and the upper electrode 150 disposed between the upper substrate 160 and the P-type thermoelectric leg 130 and between the upper substrate 160 and the N-type thermoelectric leg 140 may include at least one among Cu, Ag, and Ni and may have a thickness in the range of 0.01 mm to 0.3 mm. In a case in which a thickness of the lower electrode 120 or the upper electrode 150 is less than 0.01 mm, an electrode function thereof is degraded so that electric conductivity performance thereof may be lowered, and in a case in which the thickness thereof is greater than 0.3 mm, resistance thereof increases so that conduction efficiency thereof may be lowered.

In addition, the lower substrate 110 and the upper substrate 160 which face each other may be insulating substrates or metal substrates. The insulating substrate may be an alumina substrate or flexible polymer resin substrate. The flexible polymer resin substrate may include any insulating resin material such as high permeability plastics including polyimide (PI), polystyrene (PS), poly methyl methacrylate (PMMA), a cyclic olefin copolymer (COC), polyethylene terephthalate (PET), or a resin. The metal substrate may include Cu, a Cu alloy, or a Cu—Al alloy, and a thickness thereof may be in the range of 0.1 mm to 0.5 mm. In a case in which the thickness of the metal substrate is less than 0.1 mm or greater than 0.5 mm, since a heat dissipation property or thermal conductivity thereof may become excessively high, the reliability of the thermoelectric element may be lowered. In addition, in a case in which the lower substrate 110 and the upper substrate 160 are the metal substrates, dielectric layers 170 may be further formed between the lower substrate 110 and the lower electrodes 120 and between the upper substrate 160 and the upper electrode 150. The dielectric layer 170 may include a material having a thermal conductivity in the range of 5 to 10 W/K and may have a thickness in the range of 0.01 mm to 0.15 mm. In a case in which the thickness of the dielectric layer 170 is less than 0.01 mm, insulating efficiency or a withstanding voltage property may be lowered, and in a case in which the thickness thereof is greater than 0.15 mm, thermal conductivity is lowered so that heat dissipation efficiency may be lowered.

Here, sizes of the lower substrate 110 and the upper substrate 160 may also be different. For example, a volume, a thickness, or an area of one of the lower substrate 110 and the upper substrate 160 may be greater than that of the other. Accordingly, the heat absorption or dissipation performance of the thermoelectric element can be enhanced.

In addition, a heat dissipation pattern, for example, an irregular pattern, may also be formed on at least one surface of the lower substrate 110 and the upper substrate 160. Accordingly, the heat dissipation performance of the thermoelectric element can be enhanced. In a case in which the irregular pattern is formed on a surface in contact with the P-type thermoelectric leg 130 or N-type thermoelectric leg 140, a bonding property between the thermoelectric leg and the substrate can also be improved.

Meanwhile, the P-type thermoelectric leg 130 or N-type thermoelectric leg 140 may have a cylindrical form, a polygonal column form, an elliptical column form, or the like.

According to one embodiment of the present invention, a width of a portion, which is bonded to the electrode, of the P-type thermoelectric leg 130 or N-type thermoelectric leg 140 may be large.

In the present specification, an example of the heat sinks disposed on both surfaces of the thermoelectric element 100 including the lower substrate 110, the lower electrodes 120, the P-type thermoelectric leg 130, the N-type thermoelectric leg 140, the upper electrode 150, and the upper substrate 160 are provided, but the present invention is not limited thereto. At least one of the lower substrate 110 and the upper substrate 160 may be omitted, and the heat sinks may also serve as the lower substrate 110 and the upper substrate 160. In this case, an insulating portion may also be further disposed between the heat sink and the lower electrodes 120 or between the heat sink and the upper electrode 150.

Referring back to FIGS. 2 and 3, the first heat sink 200 is disposed on one surface of the thermoelectric element 100, for example, disposed on a side of the heating surface, and the fan 300 is coupled to the first heat sink 200. In this case, the fan 300 may be a cooling fan. The fan 300 may be used with an air conditioner.

In addition, the second heat sink 600 is disposed on another surface of the thermoelectric element 100, for example, disposed on a side of the heat-absorbing surface. In this case, the heat insulating member 400 may be further disposed between the thermoelectric element 100 and the second heat sink 600, and both of the thermoelectric element 100 and the heat insulating member 400 may be accommodated in the housing 500.

In each of the first heat sink 200 and the second heat sink 600, a plurality of flat base members having flat plate forms are disposed to be parallel to each other and may have a structure in which spaces between the flat base members form air flow paths.

Referring to FIGS. 6 to 8, the first heat sink 200 may include at least one flow path pattern 200A forming an air flow path C1 using a base member including a first flat surface 210 and a second flat surface 220 and formed as a flat plate.

As illustrated in FIGS. 6 to 8, the flow path pattern 200A may have a structure in which the base member is folded to form a curvature pattern having predetermined pitches P1 and P2 and a predetermined height T1, that is, a folded structure.

As described above, air comes into surface-contact with the first flat surface 210 and the second flat surface 220 of the first heat sink 200, and an area in surface-contact with the air may be maximized by the flow path pattern 200A.

Referring to FIG. 6, in a case in which air is introduced in a flow path direction C1, the air may move while uniformly coming into contact with the first flat surface 210 and the second flat surface 220 and move in a flow path direction C2. Accordingly, since a contact surface is large when compared to a base member having a simple flat plate form, a heat-absorbing or heating effect is improved.

According to the embodiment of the present invention, in order to further increase an area in contact with air, a protrusion type resistive pattern 230 may also be formed on the base member.

In addition, as illustrated in FIG. 7, the resistive pattern 230 may be formed to have a protruding structure inclined at a predetermined inclination angle θ in a direction in which air is introduced. Accordingly, since friction between the resistive pattern 230 and the air may be maximized, a contact surface can be increased or contact efficiency can be improved. In addition, a groove 240 may also be formed in a surface in front of the resistive pattern 230 of the base member. Since some amount of air coming into contact with the resistive pattern 230 passes through the groove 240 and moves between a front surface and a rear surface of the base member, a contact area can be further increased or contact efficiency can be further improved.

The resistive pattern 230 is illustrated to be formed on the first flat surface 210 but is not limited thereto and may also be formed on the second flat surface 220.

Referring to FIG. 8, a flow path pattern may have various modified examples.

For example, a pattern having a curvature may be repeated with a predetermined pitch P1 as illustrated in FIG. 8A, a pattern having a cutting edge portion may be repeated as illustrated in FIG. 8B, or unit patterns may also have polygonal shapes as illustrated in FIGS. 8C and 8D. Although not illustrated in the drawings, a resistive pattern may also be formed on each of surfaces B1 and B2 of the patterns.

In FIG. 8, the flow path pattern has a predetermined cycle and a height but is not limited thereto and the cycle and the height T1 of the flow path pattern may be non-uniformly changed.

In FIGS. 6 to 8, one example of the first heat sink 200 is illustrated for the sake of convenience in the description, and a structure of the first heat sink 200 included in the heat conversion device according to the embodiment of the present invention may be variously modified.

Meanwhile, according to the embodiment of the present invention, the first heat sink 200 and the fan 300 may be disposed to be spaced apart by a predetermined distance. To this end, the first heat sink 200 and the fan 300 may have elasticity, and the first heat sink 200 and the fan 300 may be fixed using a plurality of coupling members 700 which fix the first heat sink 200 to the fan 300.

As described above, when the first heat sink 200 and the fan 300 are disposed to be spaced apart by the predetermined distance, since a problem of transmitting vibration generated when the fan 300 rotates to the first heat sink 200 is minimized, vibration and noise of the first heat sink 200 can be prevented.

FIG. 9 is a view illustrating the coupling member included in the heat conversion device according to one embodiment of the present invention, and FIG. 10 is a view illustrating a part of the heat sink and a part of the fan which is coupled to the coupling member according to one embodiment of the present invention. FIG. 9A is a side view illustrating the coupling member, and FIG. 9B is a side view illustrating the coupling member turned by 90° from FIG. 9A.

Referring to FIGS. 9 and 10, the coupling member 700 includes a shaft 710, a first fixing portion 720 disposed at one end of the shaft 710 and fixed to the first heat sink 200, a second fixing portion 730 protruding from an outer circumferential surface of the shaft 710 and fixed to the fan 300, and a separating portion 740 which protrudes from the outer circumferential surface of the shaft 710, is disposed between the first heat sink 200 and the fan 300, and separates the first heat sink 200 from the fan 300.

In this case, the shaft 710, the first fixing portion 720, the second fixing portion 730, and the separating portion 740 may include silicone resins and may be integrally formed. In addition, an elastic modulus of the coupling member 700 may range from $1*10^3$ kgf/cm2 to $30*10^3$ kgf/cm2, and a hardness thereof may range from 40 to 90 Hs. In this case, a unit of hardness may be Shore hardness, and Shore hardness may be measured using a rebounded height when a falling object to which a diamond is fixed to an end portion thereof falls from a predetermined height. Accordingly, the coupling member 700 can fix the first heat sink 200 and the fan 300.

First, the first fixing portion 720 is a portion fixed to the first heat sink 200, and to this end, grooves G for fixing the first fixing portion 720 may be formed in the first heat sink 200.

The first fixing portion 720 includes a front end region 722, a middle region 724, a rear end region 726, and a connecting region 728. The front end region 722, the middle region 724, and the rear end region 726 may be integrally formed to have a cylindrical or oval column form. In this case, a diameter d1 of the front end region 722 is less than a diameter d2 of the middle region 724, and the diameter d2 of the middle region 724 may be less than a diameter d3 of the rear end region 726. For example, in a case in which the groove G formed in the first heat sink 200 has a form which accommodates the middle region 724 of the first fixing portion 720, the diameter d1 of the front end region 722 of the first fixing portion 720 may be less than a diameter D1 of the groove G formed in the first heat sink 200, the diameter d2 of the middle region 724 may be 1 to 1.1 times the diameter D1 of the groove G formed in the first heat sink 200, and the diameter d3 of the rear end region 726 may be greater than the diameter D1 of the groove G formed in the first heat sink 200. Since the middle region 724 has elasticity, even when the diameter d2 of the middle region 724 is 1 to 1.1 times the diameter D1 of the groove G formed in the first heat sink 200, the middle region 724 may be inserted into the groove G. Accordingly, after the front end region 722 of the first fixing portion 720 starts to enter and enters the groove G formed in the first heat sink 200, a position of the coupling member 700 may be fixed using the rear end region 726. In this case, a step may be formed between the middle region 724 and the rear end region 726. Accordingly, after the middle region 724 of the first fixing portion 720 enters the groove G formed in the first heat sink 200, the middle region 724 may stop due to the rear end region 726. The rear end region 726 may be fixed to the groove G formed in the first heat sink 200. For example, the rear end region 726 may be disposed in a periphery of the groove G or may also be fixed between radiation fins of the first heat sink 200. In addition, the connecting region 728 of the first fixing portion 720 may connect the middle region 724 and the separating portion 740 and may have a plate form of which a thickness is less than the diameter of the middle region 724. In this case, the groove G formed in the first heat sink 200 may further include a region through which the connecting region 728 of the first fixing portion 720 passes. A width D2 of the region through which the connecting region 728 of the first fixing portion 720 passes may be the same as the thickness of the connecting region 728 or may be 0.9 to 1.1 times the thickness of the connecting region 728, and the width D2 may be less than the diameter D1 of the groove G. Accordingly, after the middle region 724 of the first fixing portion 720 is accommodated in the groove G formed in the first heat sink 200, the middle region 724 may not be departed to the outside.

Next, the second fixing portion 730 is a portion fixed to the fan 300, and to this end, the fan 300 may include holes H through which each shaft 710 of the coupling members 700 pass. In this case, two flat plates facing each other and spaced apart from each other may be disposed at an edge of the fan 300, and the holes H may be formed in each of two flat plates to correspond to each other.

A width W of the second fixing portion 730 may increase in a direction toward the first fixing portion 720. That is, the width of the second fixing portion 730 may have a circular truncated cone form, and one surface 732 of the second fixing portion 730 may be in contact with the fan 300.

In this case, a width W2 of the one surface 732 of the second fixing portion 730 may range from 120 to 180%, preferably range from 130 to 170%, and more preferably range from 140 to 160% of a diameter of the hole H formed in the fan 300, and a width W1 of the other surface 734 opposite to the one surface 732 may range from 50 to 80%, preferably range from 55 to 75%, and more preferably range from 60 to 70% of the diameter of the hole H formed in the fan 300. As described above, in a case in which the width of the one surface 732 of the second fixing portion 730 is greater than the diameter of the hole H formed in the fan 300 and the width of the other surface 734 is less than the diameter of the hole H formed in the fan 300, after the second fixing portion 730 passes through the hole H formed in the fan 300, the second fixing portion 730 may be fixed to the fan 300. As described above, since the second fixing portion 730 has elasticity, the one surface 732, which has the width greater than the diameter of the hole H, of the second fixing portion 730 can pass through the hole H.

In this case, at least a part between the second fixing portion 730 and the shaft 710 may be empty. For example, the second fixing portion 730 may have the circular truncated cone form including at least one groove formed in the one surface 732. For example, the second fixing portion 730 may have a conical form of which an upper end portion is truncated.

Alternatively, at least a part, from which the second fixing portion 730 protrudes, in the shaft 710 may be empty.

A volume of an empty space between the second fixing portion 730 and the shaft 710 or a volume of an empty space in the shaft 710 from which the second fixing portion 730 protrudes may range from ⅓ to ⅔ of a volume of a circular truncated cone defined by upper, floor, and side surfaces of the second fixing portion 730. Alternatively, a height of the empty space between the second fixing portion 730 and the shaft 710 or a height of the empty space in the shaft 710 from which the second fixing portion 730 protrudes may be ⅓ to ⅔ of a height of the circular truncated cone defined by the upper, floor, and side surfaces of the second fixing portion 730. The form of the empty space between the second fixing portion 730 and the shaft 710 may be a conical form, and the form of the empty space in the shaft 710 from which the second fixing portion 730 protrudes may be a cylindrical form.

As described above, in the case in which at least a part between the second fixing portion 730 and the shaft 710 is empty or at least a part in the shaft 710 from which the second fixing portion 730 protrudes is empty, the elastic one surface 732, of which a width is greater than the diameter of the hole H formed in the fan 300, of the second fixing portion 730 passes through the hole H formed in the fan 300, is hooked on a periphery of the hole H, and thus, is easily fixed to the fan 300.

Next, the separating portion 740 may protrude from the shaft 710 and may be connected to the connecting region 728 of the first fixing portion 720. The separating portion 740 may have, for example, a cylindrical form or prism form, and a width of the separating portion 740 may be greater than the diameter of the hole H formed in the fan 300. Accordingly, the separating portion 740 may serve to separate the first heat sink 200 from the fan 300 by a predetermined distance. To this end, in the case in which the separating portion 740 has the cylindrical form or prism form, one of an upper surface and a lower surface may be in direct contact with the first heat sink 200, and the other one of the upper surface and the lower surface may be in direct contact with the fan 300. Diameters of the upper surface and the lower surface of the separating portion 740 may be greater than the diameter D2 of the groove G formed in the first heat sink 200 and the diameter of the hole H formed in the fan 300. Accordingly, the separating portion 740 may stably maintain the predetermined distance, which corresponds to a height of the separating portion 740, between the first heat sink 200 and the fan 300.

In this case, a height h1 of the separating portion 740 may range from 1 to 10 mm and may preferably range from 2 to 8 mm. In a case in which the height of the separating portion 740 is out of such a value range, noise may become large. For example, in a case in which the height of the separating portion 740 is less than 1 mm, cooling efficiency is high, but there is a problem of high noise. In addition, in a case in which the height of the separating portion 740 is greater than 10 mm, noise is small, but there is a problem of low cooling efficiency.

In this case, a distance h2 between the second fixing portion 730 and the separating portion 740, specifically, a distance between the one surface 732 of the second fixing portion 730 and one surface 742 of the separating portion 740, may range from 0.9 to 1 times a height of the fan 300. Accordingly, the one surface 742 of the separating portion 740 is fixed to a lower periphery 302 of the hole H formed in the fan 300, and the one surface 732 of the second fixing portion 730 is fixed to an upper periphery 304 of the hole H formed in the fan 300 so that the first heat sink 200 and the fan 300 may be stably coupled. Since the coupling member 700 according to the embodiment of the present invention has elasticity, even when the distance h2 between the second fixing portion 730 and the separating portion 740 ranges from 0.9 to 1 times the height of the fan 300, the one surface 742 of the separating portion 740 may be fixed to the lower periphery 302 of the hole H formed in the fan 300, and the one surface 732 of the second fixing portion 730 may be fixed to the upper periphery 304 of the hole H formed in the fan 300.

According to the embodiment of the present invention, the plurality of coupling members 700, for example, two, preferably three, and more preferably four coupling members, may couple the first heat sink 200 and the fan 300. To this end, the plurality of grooves G formed in the first heat sink 200 may correspond to positions of the plurality of holes H formed in the fan 300.

FIGS. 11 to 13 are views showing a process in which the first heat sink and the fan are coupled using the coupling member according to one embodiment of the present invention.

Referring to FIG. 11A, the first fixing portion 720 formed on one end of the shaft 710 of the coupling member 700 passes through the groove G formed in the first heat sink 200. In this case, the first fixing portion 720 may be inserted into a wall surface of the first heat sink 200 as illustrated in FIG. 12, or the first fixing portion 720 may also be inserted into a middle of the first heat sink 200 as illustrated in FIG. 13.

Next, referring to FIG. 11B, the other end portion of the shaft 710 of the coupling member 700 passes through the hole H formed in the fan 300. In this case, when an external force is applied to the other end portion of the shaft 710 of the coupling member 700 in an opposite direction of the first heat sink 200, and the second fixing portion 730 passes through the hole H formed in the fan 300, the coupling member 700 may stably couple the first heat sink 200 and the fan 300.

Next, referring to FIG. 11C, after the second fixing portion 730 passes through the hole H formed in the fan 300, the other end portion of the shaft 710 of the coupling member 700 is cut. As described above, in the case in which the other end portion of the shaft 710 has a structure longitudinally extending from the second fixing portion 730 and an extending portion is cut after the process of FIG. 11B, the first heat sink 200 and the fan 300 is easily coupled.

Next, referring to FIG. 11D, the process of FIGS. 11A to 11C may be repeated a plurality of times, for example, two or more, preferably three or more, and more preferably four or more times.

Accordingly, the first heat sink 200 and the fan 300 can be more stably coupled.

Meanwhile, according to another embodiment of the present invention, a coupling member may also include a plurality of second fixing portions. FIG. 14 is a side view illustrating the coupling member according to another embodiment of the present invention.

Referring to FIG. 14, a plurality of second fixing portions 730 may be disposed to be spaced a predetermined distance from each other. Here, the plurality of second fixing portions 730 are illustrated to have the same size but are not limited thereto. For example, the plurality of second fixing portions 730 may have various sizes. Accordingly, a coupling member 700 may be commonly used for a fan 300 having any height or including holes having various sizes.

Tables 1 to 7 show experimental results of cooling temperature and noise according to a spaced distance between a first heat sink and a fan.

Tables 1 to 7 are results of temperature measurements at one point of a heat-absorbing portion (heat-absorbing portion #1) and another point of the heat-absorbing portion (temperature heat-absorbing portion #2), which are performed on ten samples each having spaced distances of 0 mm, 1 mm, 4 mm, 6 mm, 8 mm, 10 mm, and 12 mm. In this case, the spaced distance is adjusted using a height of a separating portion.

TABLE 1

| Spaced Distance 0 mm Sample Number | Cooling Temperature | | | Noise dB |
|---|---|---|---|---|
| | Heat-Absorbing Portion #1 | Heat-Absorbing Portion #2 | Average | |
| 1 | −13.0 | −12.8 | −12.9 | 28 |
| 2 | −13.4 | −12.7 | −13.1 | 29 |
| 3 | −13.7 | −13.2 | −13.5 | 28 |
| 4 | −13.5 | −13.5 | −13.5 | 30 |
| 5 | −13.4 | −13.8 | −13.6 | 31 |
| 6 | −14.7 | −14.9 | −14.8 | 29 |
| 7 | −12.8 | −12.9 | −12.9 | 28 |
| 8 | −14.7 | −14.7 | −14.7 | 29 |
| 9 | −12.9 | −12.8 | −12.9 | 30 |
| 10 | −12.8 | −12.4 | −12.6 | 32 |

TABLE 2

| Spaced Distance 1 mm Sample Number | Cooling Temperature | | Sample Number | Noise Heat-Absorbing Portion #1 |
|---|---|---|---|---|
| | Heat-Absorbing Portion #1 | Heat-Absorbing Portion #2 | | |
| 1 | −12.5 | −12.0 | −12.3 | 20 |
| 2 | −13.1 | −12.6 | −12.9 | 21 |
| 3 | −13.5 | −13.0 | −13.3 | 20 |
| 4 | −13.5 | −13.1 | −13.3 | 19 |
| 5 | −13.7 | −13.4 | −13.6 | 19 |
| 6 | −14.8 | −14.8 | −14.8 | 21 |

TABLE 2-continued

| Spaced Distance 1 mm Sample Number | Cooling Temperature Heat-Absorbing Portion #1 | Cooling Temperature Heat-Absorbing Portion #2 | Cooling Temperature Sample Number | Noise Heat-Absorbing Portion #1 |
|---|---|---|---|---|
| 7 | −12.6 | −12.7 | −12.7 | 21 |
| 8 | −14.4 | −14.7 | −14.6 | 19 |
| 9 | −12.7 | −12.7 | −12.7 | 19 |
| 10 | −12.8 | −12.2 | −12.5 | 19 |

TABLE 3

| Spaced Distance 4 mm Sample Number | Cooling Temperature Heat-Absorbing Portion #1 | Cooling Temperature Heat-Absorbing Portion #2 | Cooling Temperature Sample Number | Noise Heat-Absorbing Portion #1 |
|---|---|---|---|---|
| 1 | −12.4 | −12.4 | −12.4 | 18 |
| 2 | −13.2 | −12.5 | −12.9 | 18 |
| 3 | −13.0 | −12.8 | −12.9 | 19 |
| 4 | −13.0 | −12.9 | −13.0 | 18 |
| 5 | −13.6 | −13.4 | −13.5 | 20 |
| 6 | −14.7 | −14.8 | −14.8 | 19 |
| 7 | −12.5 | −12.5 | −12.5 | 19 |
| 8 | −14.5 | −14.6 | −14.6 | 19 |
| 9 | −12.6 | −12.6 | −12.6 | 20 |
| 10 | −12.7 | −12.0 | −12.4 | 18 |

TABLE 4

| Spaced Distance 6 mm Sample Number | Cooling Temperature Heat-Absorbing Portion #1 | Cooling Temperature Heat-Absorbing Portion #2 | Cooling Temperature Sample Number | Noise Heat-Absorbing Portion #1 |
|---|---|---|---|---|
| 1 | −12.1 | −12.0 | −12.1 | 18 |
| 2 | −13.2 | −12.4 | −12.8 | 18 |
| 3 | −13.2 | −12.6 | −12.9 | 19 |
| 4 | −13.4 | −12.9 | −13.2 | 18 |
| 5 | −13.9 | −13.0 | −13.5 | 20 |
| 6 | −14.6 | −14.8 | −14.7 | 19 |
| 7 | −12.4 | −12.4 | −12.4 | 19 |
| 8 | −14.6 | −14.3 | −14.5 | 19 |
| 9 | −12.4 | −12.4 | −12.4 | 20 |
| 10 | −12.6 | −11.8 | −12.2 | 18 |

TABLE 5

| Spaced Distance 8 mm Sample Number | Cooling Temperature Heat-Absorbing Portion #1 | Cooling Temperature Heat-Absorbing Portion #2 | Cooling Temperature Sample Number | Noise Heat-Absorbing Portion #1 |
|---|---|---|---|---|
| 1 | −11.9 | −11.9 | −11.9 | 18 |
| 2 | −12.8 | −12.1 | −12.5 | 17 |
| 3 | −12.9 | −12.6 | −12.8 | 17 |
| 4 | −13.0 | −12.8 | −12.9 | 18 |
| 5 | −13.9 | −12.9 | −13.4 | 18 |
| 6 | −14.5 | −14.4 | −14.5 | 19 |
| 7 | −12.2 | −12.2 | −12.2 | 17 |
| 8 | −14.4 | −14.3 | −14.4 | 18 |
| 9 | −12.2 | −12.2 | −12.2 | 18 |
| 10 | −12.4 | −11.8 | −12.1 | 18 |

TABLE 6

| Spaced Distance 10 mm Sample Number | Cooling Temperature Heat-Absorbing Portion #1 | Cooling Temperature Heat-Absorbing Portion #2 | Cooling Temperature Sample Number | Noise Heat-Absorbing Portion #1 |
|---|---|---|---|---|
| 1 | −10.7 | −10.1 | −10.4 | 17 |
| 2 | −9.8 | −10.0 | −9.9 | 16 |
| 3 | −12.4 | −12.0 | −12.2 | 18 |
| 4 | −10.4 | −10.5 | −10.5 | 18 |
| 5 | −9.9 | −9.8 | −9.9 | 17 |
| 6 | −10.2 | −10.5 | −10.4 | 18 |
| 7 | −10.7 | −10.2 | −10.5 | 17 |
| 8 | −10.8 | −11.0 | −10.9 | 16 |
| 9 | −10.0 | −10.0 | −10.0 | 17 |
| 10 | −10.6 | −10.1 | −10.4 | 18 |

TABLE 7

| Spaced Distance 12 mm Sample Number | Cooling Temperature Heat-Absorbing Portion #1 | Cooling Temperature Heat-Absorbing Portion #2 | Cooling Temperature Sample Number | Noise Heat-Absorbing Portion #1 |
|---|---|---|---|---|
| 1 | −8.7 | −8.7 | −8.7 | 15 |
| 2 | −8.7 | −8.5 | −8.6 | 15 |
| 3 | −9.1 | −9.1 | −9.1 | 15 |
| 4 | −8.5 | −8.6 | −8.6 | 16 |
| 5 | −8.9 | −8.8 | −8.9 | 16 |
| 6 | −8.9 | −9.0 | −9.0 | 16 |
| 7 | −8.7 | −8.5 | −8.6 | 15 |
| 8 | −8.6 | −8.9 | −8.8 | 15 |
| 9 | −8.2 | −8.5 | −8.4 | 16 |
| 10 | −8.4 | −8.6 | −8.5 | 16 |

Referring to Tables 1 to 7, in the case in which the spaced distance between the first heat sink and the fan was 0 mm, cooling efficiency was high, but there was a problem of high noise. In addition, in the case in which the spaced distance between the first heat sink and the fan was 12 mm, noise was low, but there was a problem of low cooling efficiency. However, in the case in which the spaced distance between the first heat sink and the fan ranged from 1 to 10 mm or less and preferably ranged from 2 to 8 mm or less according to the embodiment of the present invention, a thermoelectric module can be obtained which had high cooling efficiency and low noise.

The thermoelectric element according to the embodiment of the present invention can be applied to power generation devices, cooling devices, heating devices, waste heat utilization devices, and the like. Specifically, the thermoelectric element according to the embodiment of the present invention is mainly applicable to optical communication modules, sensors, medical devices, measuring instruments, aerospace industry, refrigerators, chillers, automotive ventilation sheets, cup holders, washing machines, dryers, wine cellars, water purifiers, sensor power supplies, thermopiles, and the like.

In this case, a polymerase chain reaction (PCR) device is an example in which the thermoelectric element according to the embodiment of the present invention is applied to a medical device. The PCR device is for amplifying a deoxyribonucleic acid (DNA) to determine a DNA sequence and requires precise temperature control and thermal cycle. To this end, a Peltier-based thermoelectric element can be applied to the PCR device.

A photodetector is another example in which the thermoelectric element according to the embodiment of the present invention is applied to a medical device. In this case, the photodetector includes an infrared/ultraviolet detector, a charge coupled device (CCD) sensor, an X-ray detector, and a thermoelectric thermal reference source (TTRS), and the like. A Peltier-based thermoelectric element can be applied to cool the photodetector. Accordingly, a wavelength change, output degradation, resolution degradation, and the like due to an increase in a temperature in the photodetector can be prevented.

Immunoassay fields, fields of in vitro diagnostics, general temperature control and cooling systems, physiotherapy fields, liquid chiller systems, and blood/plasma temperature control fields, and the like are other examples in which the thermoelectric element according to the embodiment of the present invention is applied to a medical device. Accordingly, more precise temperature control can be performed.

An artificial heart is another example in which the thermoelectric element according to the embodiment of the present invention is applied to a medical device. Accordingly, power can be supplied to the artificial heart.

Examples in which the thermoelectric element according to the embodiment of the present invention is applied to an aerospace industry include star tracking systems, heat imaging cameras, infrared/ultraviolet detectors, CCD sensors, the Hubble Space Telescope, TTRSs. Accordingly, a temperature of an imaging sensor can be maintained.

Other examples in which the thermoelectric element according to the embodiment of the present invention is applied to an aerospace industry include cooling devices, heaters, electricity generation devices, and the like.

In addition, the thermoelectric element according to the embodiment of the present invention can be applied for generating electricity, cooling, and heating in the other industry fields.

While the invention has been shown and described with reference to the exemplary embodiments thereof, it will be understood by those skilled in the art that various changes in form and details may be made therein without departing from the spirit and scope of the invention as defined by the appended claims.

The invention claimed is:
1. A heat conversion device comprising:
a thermoelectric element;
a heat sink disposed on the thermoelectric element;
a fan disposed to be spaced a predetermined distance from the heat sink; and
a coupling member which fixes the heat sink and the fan,
wherein the coupling member includes:
 a shaft,
 a first fixing portion disposed on one end of the shaft and fixed to the heat sink,
 a second fixing portion which protrudes from an outer circumferential surface of the shaft and is fixed to the fan, and
 a separating portion which is disposed between the first fixing portion and the second fixing portion,
wherein the separating portion is disposed between the heat sink and the fan, and
wherein the shaft, the first fixing portion, the second fixing portion, and the separating portion are integrally formed,
wherein the heat sink includes a groove for fixing the first fixing portion, the groove having a diameter,
wherein the first fixing portion includes a front end region having a first diameter, a middle region having a cylindrical form with a second diameter, and a rear end region having a third diameter larger than the second diameter,
wherein the first diameter of the front end region is less than the diameter of the groove, the second diameter of the middle region is 1 to 1.1 times the diameter of the groove, and the third diameter of the rear end region is larger than the diameter of the groove,
wherein the middle region has a first end that contacts the front edge region and has a second end that contacts the rear end region, and along the entire middle region between the first end and the second end, the second diameter of the middle region is 1 to 1.1 times the diameter of the groove, and
wherein a step is provided on the first fixing portion between the middle region and the rear end region.

2. The heat conversion device of claim 1, wherein:
the fan includes a hole through which the shaft passes;
a first surface of the separating portion is in contact with a first periphery of the hole;
a first surface of the second fixing portion is in contact with a second periphery of the hole; and
a width of each of the first surface of the separating portion and the first surface of the second fixing portion is greater than a diameter of the hole.

3. The heat conversion device of claim 2, wherein:
the width of the first surface of the second fixing portion ranges from 120 to 180% of the diameter of the hole; and
a width of a second surface, which is opposite to the first surface of the second fixing portion, of the second fixing portion ranges from 50 to 80% of the diameter of the hole.

4. The heat conversion device of claim 2, wherein a distance between the first surface of the separating portion and the first surface of the second fixing portion ranges from 0.9 to 1 times a height of the fan.

5. The heat conversion device of claim 1, wherein at least a part between the second fixing portion and the shaft is empty.

6. The heat conversion device of claim 5, wherein the second fixing portion has a circular truncated cone form including at least one groove formed in a bottom surface thereof.

7. The heat conversion device of claim 1, wherein at least a part in the shaft from which the second fixing portion protrudes is empty.

8. The heat conversion device of claim 1, wherein the coupling member includes a silicone resin.

9. The heat conversion device of claim 1, wherein the coupling member has a Shore scleroscope hardness ranging from 40 to 90 Hs.

10. The heat conversion device of claim 1, wherein the coupling member has an elastic modulus ranging from $1*10^3$ kgf/cm$^2$ to $30*10^3$ kgf/cm$^2$.

11. The heat conversion device of claim 1, wherein a height of the separating portion is 1 to 10 mm.

12. The heat conversion device of claim 1, wherein the middle region of the first fixing portion is inserted into the groove.

13. The heat conversion device of claim 12, wherein the first fixing portion further includes a connecting region connecting the middle region and the separating portion,
wherein the connecting region is a plate form of which a thickness is less than the second diameter of the middle region, and the groove includes a region through which the connecting region passes.

14. The heat conversion device of claim 13, wherein a width of the region through which the connecting region passes is the same as the thickness of the connecting region or is greater than the thickness of the connecting region, and is less than the diameter of the groove.

15. The heat conversion device of claim 1, wherein the separating portion includes a first surface to directly contact the heat sink, and a second surface to directly contact the fan, wherein a height of the separating portion from the first surface to the second surface is 1 to 10 mm, wherein the separating portion is to maintain the predetermined distance from the fan to the heat sink based on the height.

16. The heat conversion device of claim 15, wherein the height of the separating portion from the first surface to the second surface is 2 to 8 mm.

* * * * *